(12) United States Patent
Iben

(10) Patent No.: US 9,275,796 B2
(45) Date of Patent: Mar. 1, 2016

(54) PROCESSES FOR IN-SITU ANNEALING OF TMR SENSORS

(71) Applicant: International Business Machines Corporation, Armonk, NY (US)

(72) Inventor: Icko E. T. Iben, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 596 days.

(21) Appl. No.: 13/629,450

(22) Filed: Sep. 27, 2012

(65) Prior Publication Data

US 2013/0019466 A1 Jan. 24, 2013

Related U.S. Application Data

(62) Division of application No. 12/106,190, filed on Apr. 18, 2008, now Pat. No. 8,331,064.

(51) Int. Cl.
| | |
|---|---|
| *H01L 43/12* | (2006.01) |
| *H01F 41/14* | (2006.01) |
| *H01F 41/30* | (2006.01) |
| *G11B 5/39* | (2006.01) |
| *B82Y 25/00* | (2011.01) |
| *B82Y 40/00* | (2011.01) |

(Continued)

(52) U.S. Cl.
CPC .............. *H01F 41/304* (2013.01); *B82Y 25/00* (2013.01); *B82Y 40/00* (2013.01); *G01R 33/098* (2013.01); *G11B 5/3106* (2013.01); *G11B 5/3906* (2013.01); *G11B 5/3909* (2013.01); *G11B 5/3967* (2013.01); *H01F 10/3254* (2013.01); *H01F 41/302* (2013.01); *H01L 43/12* (2013.01); *G11B 5/40* (2013.01); *Y10T 29/49021* (2015.01); *Y10T 29/49034* (2015.01); *Y10T 29/49043* (2015.01)

(58) Field of Classification Search
CPC ... H01F 43/12; H01F 10/3254; H01F 41/302; H01F 41/304; H01L 41/302; H01L 41/304; H01L 43/12; G11B 5/3106; G11B 5/3906; G11B 5/3909; G11B 5/3967; G11B 5/40; B82Y 25/00; B82Y 40/00; G01R 33/098; Y10T 29/49021; Y10T 29/49034; Y10T 29/49043
See application file for complete search history.

(56) References Cited

U.S. PATENT DOCUMENTS

| | | | |
|---|---|---|---|
| 6,265,885 B1 | 7/2001 | Luo et al. | |
| 6,507,464 B1 * | 1/2003 | Ohashi et al. | ........ G11B 5/3967 |

(Continued)

FOREIGN PATENT DOCUMENTS

| | | | | |
|---|---|---|---|---|
| JP | 2005332838 A | * | 12/2005 | .............. H01L 43/10 |

OTHER PUBLICATIONS

Restriction/Election Requirement from U.S. Appl. No. 12/106,190 dated Oct. 7, 2011.

(Continued)

*Primary Examiner* — A. Dexter Tugbang
(74) *Attorney, Agent, or Firm* — Zilka-Kotab, PC

(57) ABSTRACT

A method in one embodiment includes applying a current to a lead of a tunneling magnetoresistance sensor for inducing joule heating of the lead or a heating layer, the level of joule heating being sufficient to anneal a magnetic layer of the sensor; and maintaining the current at the level for an amount of time sufficient to anneal the tunneling magnetoresistive (TMR) sensor. Additional systems and methods are also presented.

17 Claims, 7 Drawing Sheets

(51) Int. Cl.
  *G01R 33/09* (2006.01)
  *G11B 5/31* (2006.01)
  *H01F 10/32* (2006.01)
  *G11B 5/40* (2006.01)

(56) References Cited

U.S. PATENT DOCUMENTS

| | | | |
|---|---|---|---|
| 6,751,052 B1 * | 6/2004 | Tagawa et al. | G11B 5/3967 |
| 6,788,500 B2 | 9/2004 | Baril et al. | |
| 7,133,254 B2 | 11/2006 | Hamann et al. | |
| 7,151,651 B1 | 12/2006 | Cross et al. | |
| 8,331,064 B2 | 12/2012 | Iben | |
| 2002/0054462 A1 * | 5/2002 | Sun et al. | H01L 43/12 |
| 2004/0240096 A1 | 12/2004 | Baril et al. | |
| 2005/0190496 A1 | 9/2005 | Hamann et al. | |
| 2006/0127701 A1 * | 6/2006 | Ruigrok et al. | H01L 41/302 |
| 2007/0230000 A1 | 10/2007 | Alex et al. | |
| 2008/0084628 A1 | 4/2008 | Ohta et al. | |
| 2009/0260719 A1 | 10/2009 | Iben | |

OTHER PUBLICATIONS

Non-Final Office Action Summary from U.S. Appl. No. 12/106,190 dated Feb. 14, 2012.
Notice of Allowance and Fee(s) Due from U.S. Appl. No. 12/106,190 dated Aug. 7, 2012.
Iben, I. E.T., "Head reliability of AMR sensors based on thermal stress tests," 2003 IBM, IBM J. Res. & Dev., vol. 47, No. 4, Jul. 2003, pp. 415-428.
Iben et al., "Steady-state thermal characteristics of AMR read/write heads used in tape storage drives," 2003 IBM, IBM J. Res. & Dev., vol. 47, No. 4, Jul. 2003, pp. 401-414.
Jiang et al., "Pulse Stress Testing for Ultra-thin MgO Barrier Magnetic Tunnel Junctions," EOS/ESD Symposium Proceedings, 2007, pp. 1-6.
Iben, I.E.T., U.S. Appl. No. 12/106,190, filed Apr. 18, 2008.

* cited by examiner

PROCESSES FOR IN-SITU ANNEALING OF TMR SENSORS

RELATED APPLICATIONS

This application is a divisional of U.S. Pat. No. 8,331,064, filed Apr. 18, 2008; which is herein incorporated by reference.

FIELD OF THE INVENTION

The present invention relates to magnetic sensor annealing, and more particularly, this invention relates to annealing a Tunneling Magnetoresistance (TMR) sensor.

BACKGROUND OF THE INVENTION

In magnetic storage systems, data is read from and written onto magnetic recording media utilizing magnetic transducers commonly. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has lead to increasing the track density on recording tape, and decreasing the thickness of the magnetic tape medium. However, the development of small footprint, higher performance tape drive systems has created various problems in the design of a tape head assembly for use in such systems.

TMR sensors are used as readers in magnetic storage systems such as hard disk drives (HDD) and could be used in tape drives. Some TMR sensors have been shown to have an intrinsic defect which is caused by stress voltages. Particularly, both intrinsic and extrinsic breakdown behaviors have been observed. The intrinsic breakdown is characterized by an abrupt resistance drop in the TMR at the failure voltage, while extrinsic breakdown is characterized by a gradual drop in the resistance of the TMR.

SUMMARY OF THE INVENTION

A method in one embodiment includes applying a current to a lead of a tunneling magnetoresistance sensor for inducing joule heating of the lead or a heating layer, the level of joule heating being sufficient to anneal a magnetic layer of the sensor; and maintaining the current at the level for an amount of time sufficient to anneal the tunneling magnetoresistive (TMR) sensor.

Any of these embodiments may be implemented in a magnetic data storage system such as a tape drive system, which may include a magnetic head as recited above, a drive mechanism for passing a magnetic medium (e.g., recording tape) over the magnetic head, and a controller electrically coupled to the magnetic head.

Other embodiments of the present invention will become apparent from the following detailed description, which, when taken in conjunction with the drawings, illustrate by way of example the principles of the invention.

DETAILED DESCRIPTION

Figure 1:
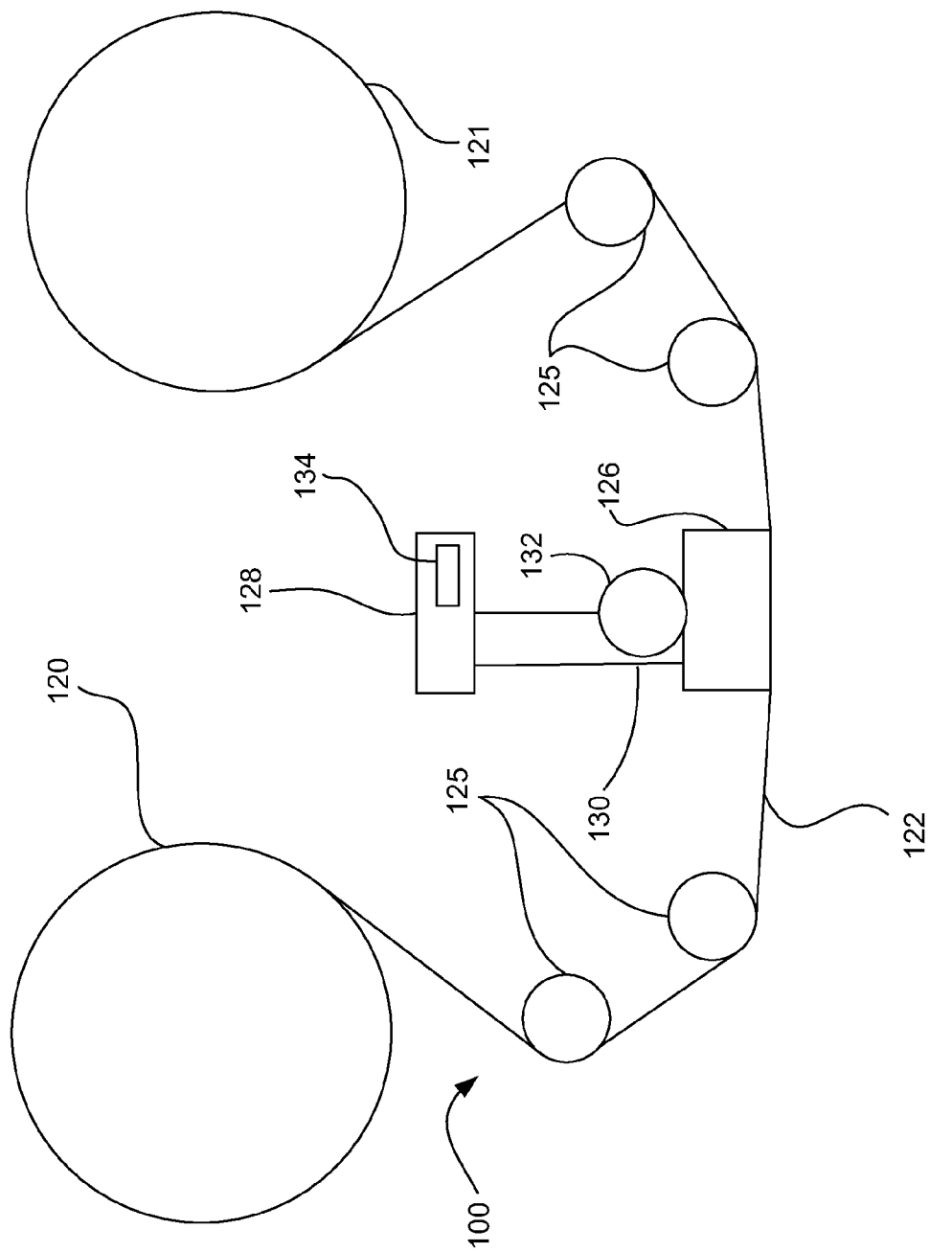
FIG. 1 is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a method includes applying a current to a lead of a tunneling magnetoresistance sensor for inducing joule heating of the lead or a heating layer, the level of joule heating being sufficient to anneal a magnetic layer of the sensor; and maintaining the current at the level for an amount of time sufficient to anneal the tunneling layer and/or the magnetic layers of the sensor. The lead structure(s) is (are) connected in a circuit such that the joule heating current passes through a thin film metal layer rather than through the tunnel junction.

In another general embodiment, a system includes a first lead coupled to one end of a tunneling magnetoresistance sensor stack; a second lead coupled to another end of the sensor stack; and a third lead coupled to the first lead, the third lead being selectively coupleable to a ground, and the first lead is selectively coupled to a voltage (current) source, wherein a current passing through the first lead to the third lead when the third lead is coupled to the ground does not significantly traverse the sensor stack, wherein the first and third leads are characterized in that a current applied to the first lead at a predetermined level when the third lead is coupled to the ground induces joule heating of the first lead or a heating layer coupled to the first and third leads, the joule heating applied for a predetermined amount of time being sufficient to anneal a magnetic layer of the sensor.

In another general embodiment, a system includes a first lead coupled to one end of a tunneling magnetoresistance sensor stack, and where the first lead is selectively coupled to a voltage (current) source; a second lead coupled to another end of the sensor stack, and where the second lead is also selectively coupled to a voltage (current) source; a third lead coupled to the first lead, the third lead being selectively coupleable to a ground; and a fourth lead coupled to the second lead, the fourth lead being selectively coupleable to the ground. The first and third leads are characterized in that a current applied to the first lead at a predetermined level when the third lead is coupled to the ground induces joule heating of the first lead or a heating layer coupled to the first and third leads, wherein the second and fourth leads are characterized in that a current applied to the second lead at a predetermined level when the fourth lead is coupled to the ground induces joule heating of the second lead or a heating layer coupled to the second and fourth leads, the combined joule heating generated for a predetermined amount of time being sufficient to anneal a magnetic layer of the sensor. The connections are such that the magnetic field generated within the Tunnel Junction (TJ) stack from the currents passing through the first and third leads opposes the magnetic field generated within the TJ stack from the second and fourth leads. In this configuration the second and the fourth leads are aligned as mirror images of the first and third leads respectively.

One reason for the above mentioned alignment is to minimize the magnetic fields within the TMR. Another important reason is to minimize the voltage differential across the oxide, tunneling, layer of the TMR.

In yet another general embodiment, a system includes a tunneling magnetoresistance sensor; a heating layer for heating the sensor, the heating layer being external to a thin film stack of the sensor; and leads coupled to the heating layer, wherein the heating layer is characterized in that a current applied thereto at a predetermined level for a predetermined amount of time anneals a magnetic layer of the sensor.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface may also be provided for communication between the tape drive and a host (integral or external) to send and receive the data and for controlling the operation of the tape drive and communicating the status of the tape drive to the host, all as will be understood by those of skill in the art.

Figure 2:
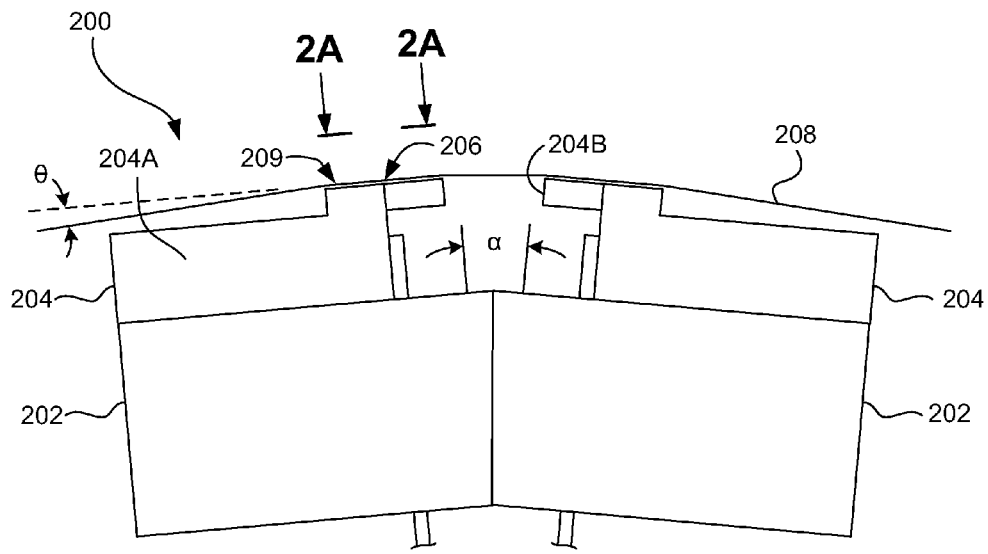
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases are typically "U-beams" that are adhesively coupled together. Each module 204 includes a substrate 204A and a closure 204B with a gap 206 comprising readers and/or writers situated therebetween. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers.

Figure 2A:
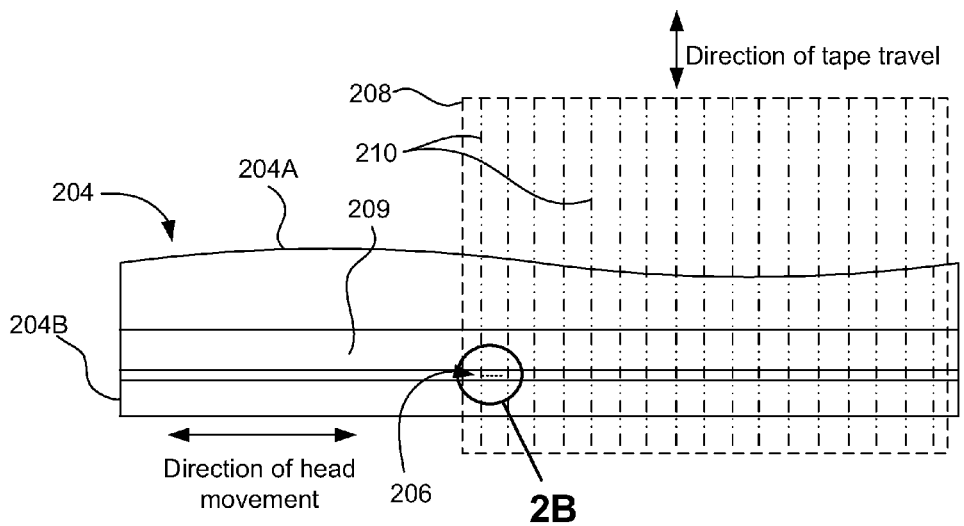
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 12-22 data bands, e.g., with 16 data bands and 17 servo tracks 210, as shown in FIG. 2A on a one-half inch wide tape 208. The data bands are defined between servo tracks 210. Each data band may include a number of data tracks, for example 96 data tracks (not shown). During read/write operations, the elements 206 are positioned within one of the data bands. Outer readers, sometimes called servo readers, read the servo tracks 210. The servo signals are in turn used to keep the elements 206 aligned with a particular track during the read/write operations.

Figure 2B:
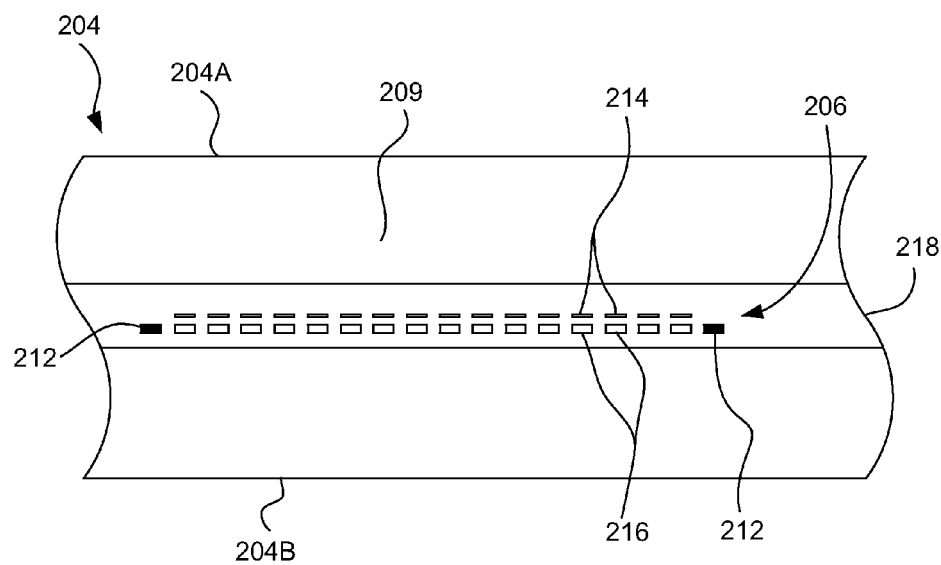
FIG. 2B is a detailed view taken from Circle 2B of FIG. 2A.

FIG. 2B depicts a plurality of read and/or write elements 206 formed in a gap 218 on the module 204 in Circle 2B of FIG. 2A. As shown, the array of elements 206 includes, for example, 16 writers 214, 16 readers 216 and two servo readers 212, though the number of elements may vary. Illustrative embodiments include 8, 16, 32, and 40 elements per array 206. A preferred embodiment includes 16 readers per array and/or 16 writers per array. The more the elements in an array, the higher the data rate for a given tape speed. The choice of the exact number of elements required is, among other issues, a trade off of cost of electronics per element, the possibility in defects, whereby 1 defective elements renders the array useless, the data rate transfer required. While the readers and writers may be arranged in a piggyback configuration as shown in FIG. 2B, the readers 216 and writers 214 may also be arranged in an interleaved configuration. Alternatively, each array of elements 206 may be readers or writers only, and the arrays may contain one or more servo readers 212. As noted by considering FIGS. 2 and 2A-B together, each module 204 may include a complementary set of elements 206 for such things as bi-directional reading and writing, read-while-write capability, backward compatibility, etc.

Figure 2C:
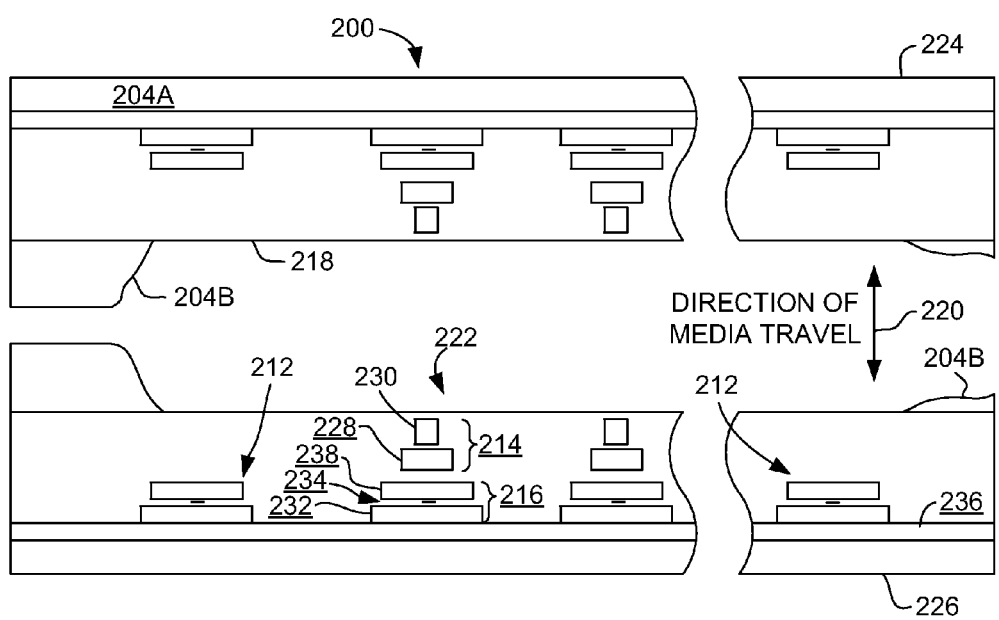
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Another type of magnetic recording system is a hard disk drive system. Such a system generally includes a slider having a magnetic head with a sensor and a writer. The slider flies above a rotating magnetic disk, and is positioned over the appropriate data track on the disk by an actuator. Typically, a controller is present for managing the positioning and operation of the head.

Figure 3:
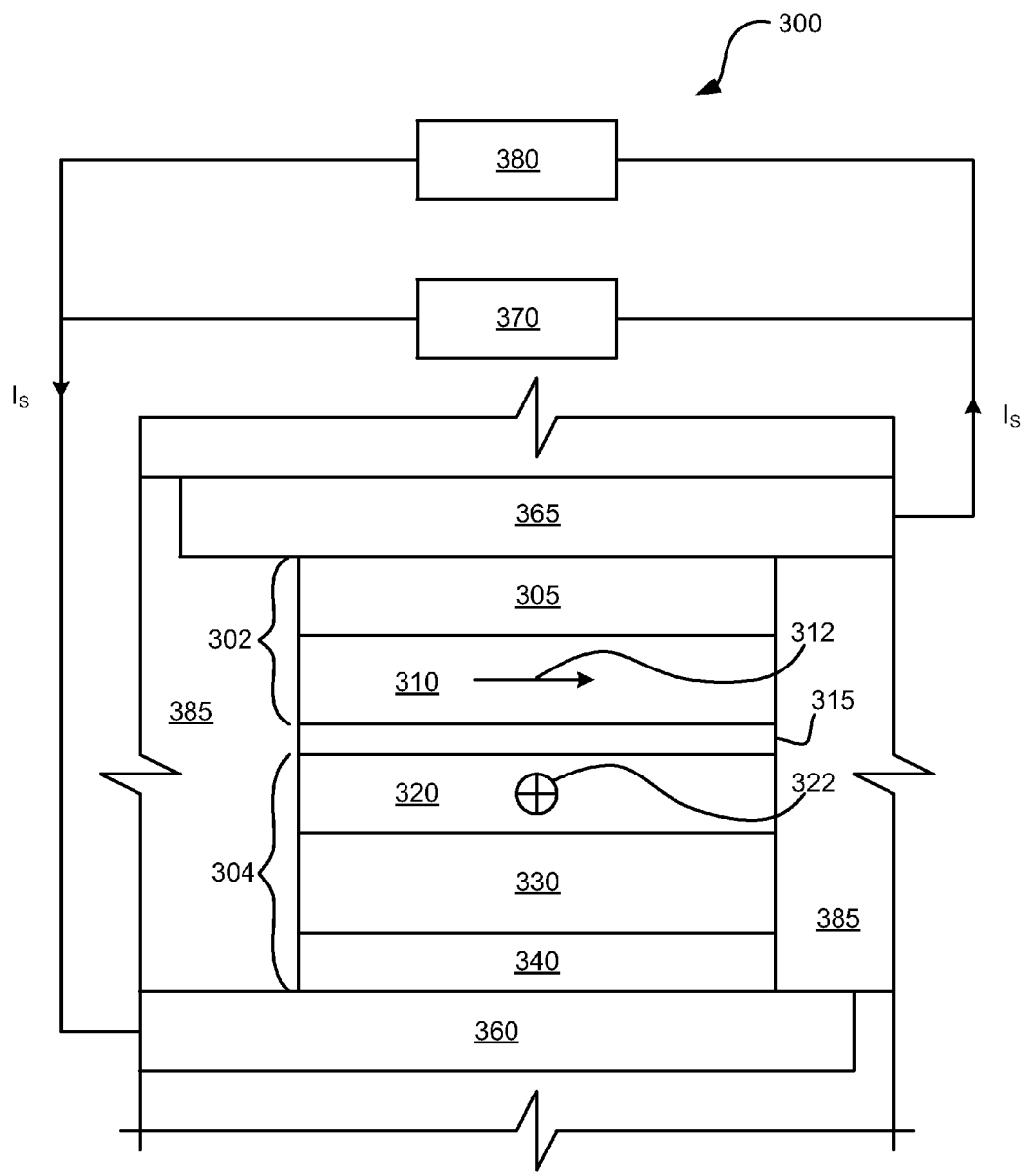
FIG. 3 is a system diagram of an illustrative system having a tunneling magnetoresistance (TMR) sensor according to one embodiment.

FIG. 3 illustrates an illustrative system 300 having a tunneling magnetoresistance (TMR) sensor (also known as a Magnetic Tunnel Junction (MTJ) sensor) that may be implemented in any of the embodiments described above. It should be noted, however, that the sensor 300 may be implemented in any type of system or environment in which magnetic sensors can be employed.

A TMR device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetizations of the two ferromagnetic layers. In a typical TMR sensor, one ferromagnetic layer (pinned layer) has its magnetization fixed, or pinned, and the other ferromagnetic layer (free layer) has its magnetization free to rotate in response to an external magnetic field, such as that emanating from the recorded magnetic transitions written to the recording medium (the signal field). When an electric potential (voltage) is applied across the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium whereby the magnetic flux emanating from the media causes a change of direction of magnetization of the free layer, which in turn causes a change in the resistance of the MTJ sensor and a corresponding change in the sensed current or voltage.

With continued reference to FIG. 3, the TMR sensor comprises a first electrode 304, a second electrode 302, and a tunnel barrier layer 315, typically of a metal oxide such as, but not limited to, $AlO_x$, $MgO_x$, etc. The first electrode 304 comprises a pinned layer (pinned ferromagnetic layer or reference layer) 320, an antiferromagnetic (AFM) layer 330, and a seed layer 340. The magnetization of the pinned layer 320 is fixed through exchange coupling with the AFM layer 330. The second electrode 302 comprises a free layer (free ferromagnetic layer) 310 and a cap layer 305. The free layer 310 is separated from the pinned layer 320 by a nonmagnetic, electrically insulating tunnel barrier layer 315. In the absence of an external magnetic field, the free layer 310 has its magnetization oriented in the direction shown by arrow 312, that is, generally perpendicular to the magnetization direction of the pinned layer 320 shown by arrow 322 (tail of an arrow pointing into the plane of the paper). The magnetization orientation is, in part, determined by the hard bias magnets 385 oriented on either side of the MTJ. A first lead 360 and a second lead 365 formed in contact with first electrode 304 and second electrode 302, respectively, provide electrical connections for the flow of sensing current $I_s$ from a current source 370 to the TMR sensor 300. The first 360 and second 365 leads could also attach to the ends of the first 304 and second 302 electrodes rather than forming additional layers parallel to the first and second electrodes.

Because the sensing current is perpendicular to the plane of the sensor layers, the TMR sensor is known as a current-perpendicular-to-plane (CPP) sensor. A signal detector 380, typically including a recording channel such as a partial-response maximum-likelihood (PRML) channel, connected to the first and second leads 360 and 365 senses the change in resistance due to changes induced in the free layer 310 by the external magnetic field.

It should be noted that various embodiments of the present invention may deviate from the system shown in FIG. 3. For example, various embodiments may include more or fewer layers, other layers, hard bias layers flanking the sensor stack, etc.

As noted above, some TMR sensors can be degraded by stresses and events such as current pulses and Electrostatic Discharge (ESD) events. While not wishing to be bound by any theory, it is believed that one method of TMR degradation is a process of trap generation and trapped charge accumulation. The resistance decrease trend before hard breakdown is a symptom of this trap development. Physically, under high current/voltage stress, the broken bonds (both bulk and interfatial) may act as electron traps, which result in a reversible damage to the tunneling properties of the oxide.

Considering the trapping effect during voltage stress, an apparent decrease of the effective barrier thickness is related to trap generation in barrier probably, so called "trap-assisted tunneling" (TAT) make more electrons to tunnel through ultra thin barrier with one more steps. Tunneling current (conductivity) is sensitive to the thickness change, i.e., the conductivity of barrier will be determined by the longest distance from trap to either electrode, TAT inside one barrier can increase the tunneling current (conductivity) obviously. So, it is one possible explanation of the observed "slightly increased conductivity" after electrical stress, which can be parameterized by a decrease in the effective barrier thickness. The trap state available for electrons to tunnel, or the charge state of trap in barrier can modify the form of the barrier potential, giving new effective barrier values after electrical stress. The apparent increase of the barrier height is probably a result of trapped negative charge (electrons) accumulation inside the barrier.

However, the degradation of the TMR sensor functionality associated with charge trapping can be reversed by annealing the sensor at a predetermined temperature for a predetermined amount of time. Particularly, after annealing, the TMR recovers to about its initial state, presumably by releasing the trapped charges.

While the TMR sensor may be annealed in an oven, there are at least two problems with annealing in an oven. One problem is that annealing in an oven requires removing the part from the manufacturing line or from the drive to do the annealing. This is time consuming and costly. Another problem is that, for a head used in tape drives, a closure is usually glued onto the head. For most glues, the annealing temperature is well above the glass transition of the adhesive used to glue the closure and so the closure will move, making the parts unusable. Therefore, it would be desirable to generate the annealing heat from within the head.

Figure 4:
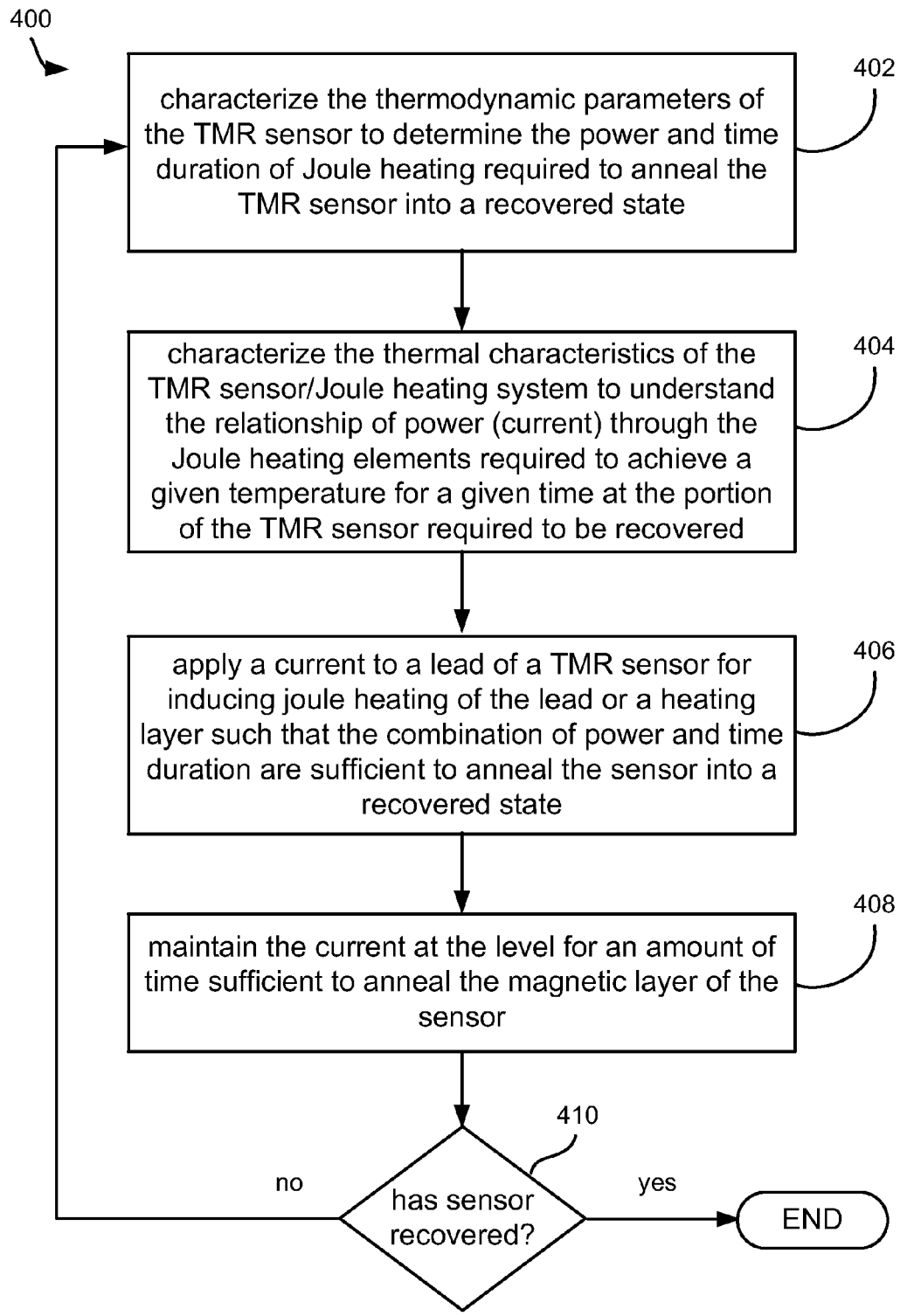
FIG. 4 is a flow diagram of a method for annealing a TMR sensor according to one embodiment.

FIG. 4 illustrates a method 400 for annealing a TMR sensor according to one embodiment. As an option, the present method 400 may be implemented in the context of the functionality and architecture of FIGS. 1-3. However, method 400 may be carried out in any desired environment. It should be noted that the aforementioned definitions may apply during the present description.

In optional operation 402, the thermodynamic parameters of the TMR sensor are characterized to determine the power and time duration of Joule heating required to anneal the TMR sensor into a recovered state.

In optional operation 404, the thermal characteristics of the TMR sensor/Joule heating system are characterized to understand the relationship of power (current) through the Joule heating elements required to achieve a given temperature for a given time at the portion of the TMR sensor required to be recovered. Note that the information determined in operations 402 or 404 may already be known for a particular type of TMR sensor, and so some approaches need not perform these steps.

With continued reference to FIG. 4, in operation 406, a current is applied to a lead of the TMR sensor for inducing joule heating of the lead or a heating layer (e.g., heating element), the level of joule heating being sufficient to anneal a magnetic layer (e.g., pinned layer 320, FIG. 3) of the sensor, e.g., such that the combination of the power and a predetermined or dynamically-determined time duration are sufficient to anneal the sensor into a recovered state. Note that the lead may be a unitary structure, or a combination of components such as a conductive via and a magnetic shield or hard bias layer.

The currents used for the annealing could be either lower values and longer times (in the regime of seconds or minutes or hours), or could be higher currents to achieve annealing in shorter times such as millisecond or microsecond or nanosecond time regimes.

In operation 408, the current is maintained at the level for an amount of time sufficient to anneal the magnetic layer of the sensor. In general, the heating is below that which would damage other parts of the head, but high enough to anneal the structure. For example, the current is sufficient to heat the magnetic layer to between about 100° C. and about 300° C. for between about 30 seconds and about 5 hours at a current of between about 1 and about 100 mA. In one illustrative approach, for a TMR sensor having a MgO barrier of about ~5.5 Å thick, the current is sufficient to heat the magnetic layer to about 120° C. for about 2 hours, which should be sufficient to anneal such a sensor. Those skilled in the art will appreciate that the time and annealing temperature may be tuned to the sensor, and so the ranges listed above are not to be construed as limiting.

Accordingly, because Joule heating is performed, the annealing may be performed in situ in the drive having the TMR sensor installed therein.

In particularly preferred approaches, no external magnetic field is applied to the magnetic layer during the annealing. Any magnetic field created by the current passing through the leads is not considered an external magnetic field.

Figure 5:
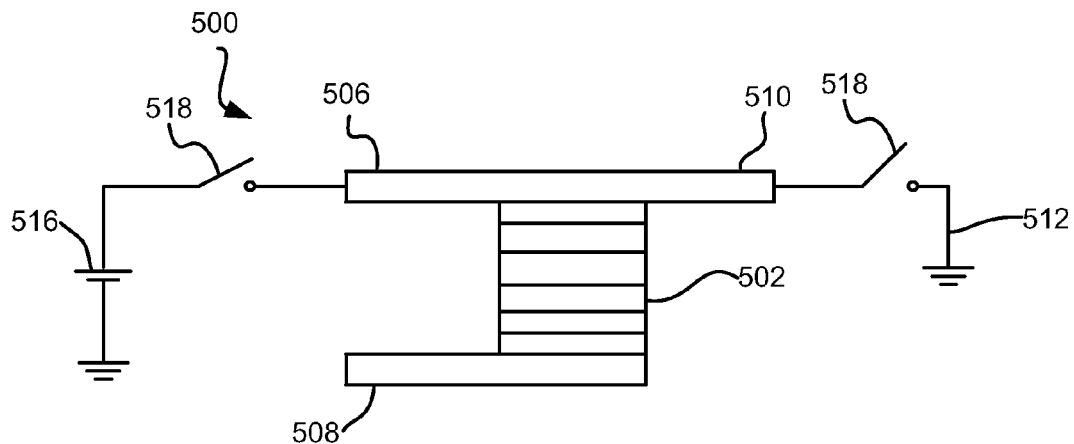
FIG. 5 is a system diagram of an illustrative system having a TMR sensor according to one embodiment.

FIG. 5 depicts an illustrative system 500 having a TMR sensor 502 according to one embodiment. As an option, the present system 500 may be implemented in the context of the functionality and architecture of FIGS. 1-4. However, the system 500 may be implemented in any desired environment. It should be noted that the aforementioned definitions may apply during the present description.

In general, TMR sensors can not carry significant current levels through the tunnel junction to self heat sufficiently to anneal out defects. One reason for low current levels is damage to the TJ either from intrinsic or extrinsic causes. For example, extant disk drives use TMR sensors with oxides that are damaged by 0.5 to 1 V across the TJ. Such sensors have resistances of the order of 300 ohms, so the current levels that result in damage are of the order of 1.6 or 3.3 mA.

As shown in FIG. 5, the system includes a first lead 506 coupled to one end of a tunneling magnetoresistance sensor stack 502. The first lead 506 is selectively coupled to a voltage/current source 516. A second lead 508 is coupled to another end of the sensor stack. A third lead 510 is coupled to the first lead, the third lead being selectively coupleable to a ground 512. During Joule heating, lead 506 is coupled to a voltage/current source while lead 510 is coupled to ground and current, is passed through the first lead to the third lead. Since lead 508 is floating, current does not significantly traverse the sensor stack. Note that there may or may not be some current leakage across the sensor stack. To minimize current flow through lead 508, during Joule heating, lead 508 should be disconnected from external contacts.

The first and third leads are characterized in that a current applied to the first lead at a predetermined level when the third lead is coupled to the ground induces joule heating of the first lead or a heating layer coupled to the first and third leads. When the joule heating is applied for a predetermined amount of time, it is sufficient to anneal a magnetic layer of the sensor. An example of a heating layer is a thin metal film.

As shown, the first lead is also used for applying a sense current to the sensor. However, in some embodiments, the first lead may not be used for applying a sense current to the sensor.

While the direction that the current is applied is not critical, it may be beneficial to use the magnetic field created by the current flow to assist in the annealing. Those skilled in the art could, if necessary, choose the direction of current flow appropriately to create the appropriate magnetic field. For example, in FIG. 5, if the direction of current flow is from lead 506 to lead 510, then a magnetic field will be created in the stack pointing into the page. If the direction of current flow is reversed to go from lead 510 to lead 506, then a magnetic field will be created in the stack pointing out of the page. An example of a desire to orient the current-flow generated magnetic field would be to generate a field in the pinned-AFM layers in a direction that it supports the preferred alignment of the magnetization in those layers.

Figure 6A:
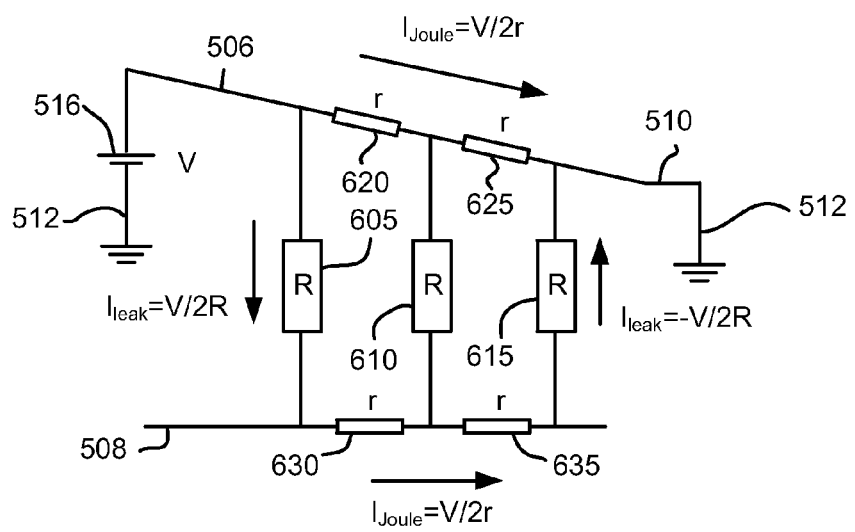
FIG. 6A is an electrical schematic of the current flow for a TMR sensor during annealing by Joule heating currents according to the method shown in FIG. 5.

Though the current flow through the stack should be minimal, under the embodiment shown in FIG. 5, some current flow will pass through the stack. FIG. 6A shows a simplified example of this. In FIG. 6A, the stack is represented as three equal resistors 605, 610 and 615, all of value R. The total resistance across the TMR, then is given by R/3. The metal connecting leads 506 and 510 and along 508 under the TJ are assumed to have identical resistance properties, and are divided into two about equal resistors 620 and 625 of resistance r. Resistor 620 connects the top ends of resistors 605 and 610, while resistor 625 connects the top ends of resistors 610 and 615 The bottom lead has about two equal resistor 630 and 635. Resistor 630 connects the bottom ends of resistors 605 and 610, while resistor 635 connects the bottom ends of resistors 610 and 615. When a voltage source of value V is connected to lead 506, and a ground source is connected to lead 510, current flows between 506 and 510 of level $I_{Joule}$=V/2r. A leakage current will flow of $I_{leak}$~V/2R through resistor 605 while a leakage current $I_{leak}$~−V/2R will flow through resistor 615. If R~1000Ω, and r~10Ω, then $I_{leak}/I_{Joule}$ will be about 1%, so this may be ok. If, on the other hand, r~100 W, the $I_{leak}/I_{Joule}$ will be about 10%. Furthermore, if the voltage level V/2 is of the order of the damage threshold for the tunnel junction, then this embodiment may not be advantageous.

In some instances, it may be beneficial to reduce the voltage differential across the sensor stack.

Accordingly, in one approach, a current is also applied to the second lead. In a further approach, described generally with reference to FIG. 7, current can pass along both sides of the sensor.

Figure 7:
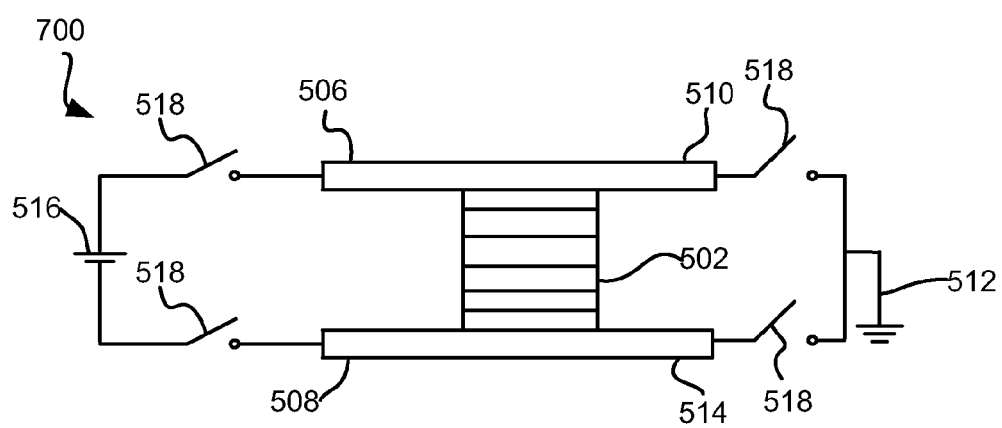
FIG. 7 is a system diagram of an illustrative system having a TMR sensor according to one embodiment.

FIG. 7 depicts an illustrative system 700 having a TMR sensor 502 according to another embodiment. As an option, the present system 700 may be implemented in the context of the functionality and architecture of FIGS. 1-4. However, the system 700 may be implemented in any desired environment. It should be noted that the aforementioned definitions may apply during the present description.

As shown in FIG. 7, the system includes a first lead 506 coupled to one end of a tunneling magnetoresistance sensor stack 502. A second lead 508 is coupled to another end of the sensor stack. A third lead 510 is coupled to the first lead A fourth lead 514 is coupled to the second lead. The third and fourth leads being selectively coupleable together to the ground 512 using switches 518. The first and third leads are being selectively coupleable together to a voltage/current source 516 using switches 518. The first and third leads are characterized in that a current applied to the first lead at a predetermined level when the third lead is coupled to the ground induces joule heating of the first lead or a heating layer coupled to the first and third leads. The second and fourth leads are characterized in that a current applied to the second lead at a predetermined level when the fourth lead is coupled to the ground induces joule heating of the second lead or a heating layer coupled to the second and fourth leads. The combined joule heating generated for a predetermined amount of time being sufficient to anneal a magnetic layer of the sensor.

While the voltage applied to the first and third leads 506, 510 may be different, in the preferred embodiment, they are the same. As described above, when the same voltage level is desired, the first and third leads 506, 510 are tied together to get the same voltage. If a different voltage is desired across leads 508 to 518 than across leads 506 and 510, then the two leads would not be tied together.

Figure 6B:
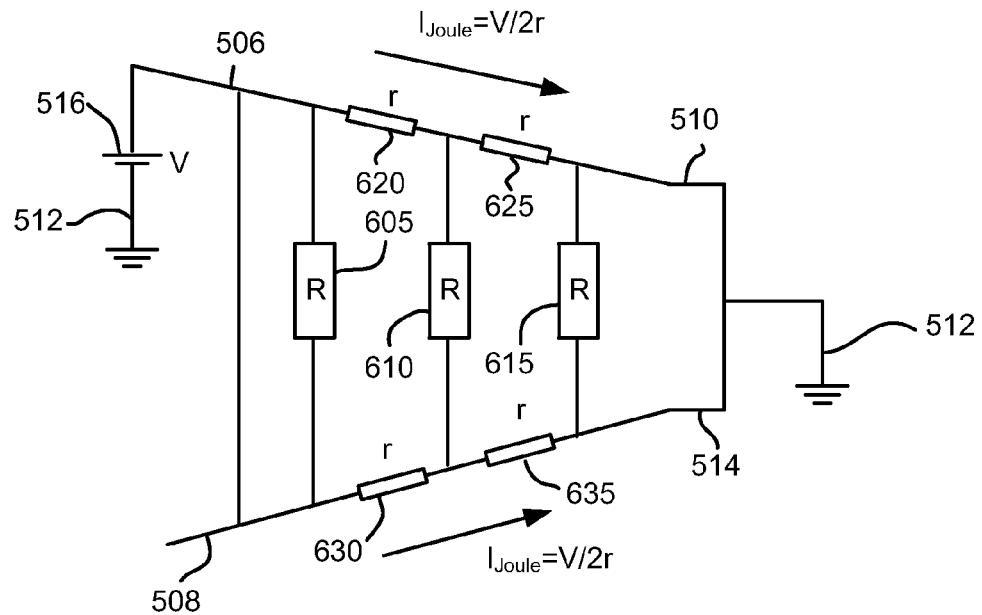
FIG. 6B is an electrical schematic of the current flow for a TMR sensor during annealing by Joule heating currents according to the method shown in FIG. 7.

A schematic to explain the minimization of leakage current and of voltage differential across the TJ is shown in FIG. 6B for the case when the voltage drop cross leads 508 to 518 is equal to that across leads 506 and 510. In FIG. 6B, the stack is represented as three equal resistors 605, 610 and 615, all of value R. The total resistance across the TMR, then is given by R/3. The metal connecting leads 506 and 510 and 508 to 514 under the TJ are assumed to have identical resistance properties, and are divided into two equal resistors 620 and 625 of resistance r. Resistor 620 connects the top ends of resistors 605 and 610, while resistor 625 connects the top ends of resistors 610 and 615. The bottom lead has two equal resistors 630 and 635. Resistor 630 connects the bottom ends of resistors 605 and 610, while resistor 635 connects the bottom ends of resistors 610 and 615. When a voltage source of value V is connected to leads 506 and 508, and a ground source is connected to leads 510 and 514, current flows between 506 and 510 of level $I_{Joule}$=V/2r and an equal current flows between 508 and 514 of level $I_{Joule}$=V/2r. With this symmetric circuit, no leakage current should flow through resistors 605, 610 or 615. Furthermore, there should be no voltage drop across either resistor: 605, 610 or 615.

Figure 8:
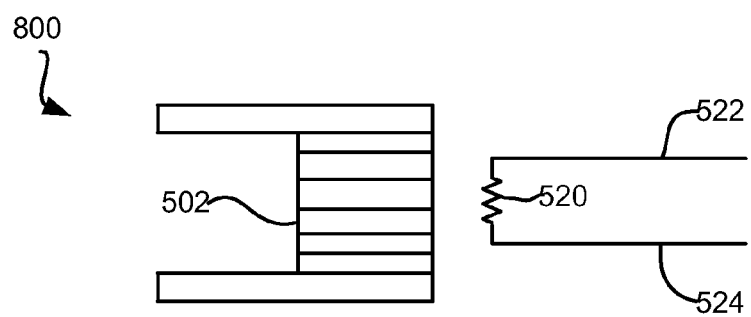
FIG. 8 is a system diagram of an illustrative system having a TMR sensor according to one embodiment.

FIG. 8 illustrates an embodiment 800 in which the heating is generated externally of the sensor stack. As an option, the present system 800 may be implemented in the context of the functionality and architecture of FIGS. 1-6. However, the system 800 may be implemented in any desired environment. It should be noted that the aforementioned definitions may apply during the present description.

As shown, the system 800 includes a TMR sensor 502, a heating layer 520 for heating the sensor, the heating layer being external to a thin film stack of the sensor, and preferably electrically isolated therefrom. Leads 522, 524 are coupled to the heating layer. The heating layer is characterized in that a current applied thereto at a predetermined level for a predetermined amount of time anneals a magnetic layer of the sensor. By using a Joule heating element which is electrically isolated but thermally connected, such as by using a thin electrical insulating layer, one could avoid the potential of dielectric breakdown or other voltage induced damage across the TJ.

The heating layer may be any type of heating layer, such as a thermal element, etc.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    applying a current to a lead of a tunneling magnetoresistance sensor for inducing joule heating of the lead or a heating layer, the level of joule heating being sufficient to anneal a magnetic layer of the sensor; and
    maintaining the current at the level for an amount of time sufficient to anneal the tunneling magnetoresistive (TMR) sensor,
    wherein no external magnetic field is applied to the sensor during application of the current.

2. A method as recited in claim 1, wherein the lead is also a lead used for applying a sense current to the sensor.

3. A method as recited in claim 1, wherein the lead is not used for applying a sense current to the sensor when the current is applied to the lead.

4. A method as recited in claim 1, wherein the current does not pass through the magnetic layer when the current is applied to the lead.

5. A method as recited in claim 1, wherein the current is applied in a drive having the sensor installed therein.

6. A method as recited in claim 5, wherein the drive is a tape drive.

7. A method as recited in claim 5, wherein the drive is a hard disk drive.

8. A method as recited in claim 1, comprising applying a second current to a second lead of the sensor, the second lead being positioned on an opposite side of a tunnel junction layer of the TMR sensor as the lead, the second current reducing a voltage differential across the magnetic layer.

9. A method, comprising:
    determining a current level and a current application duration, the current level and a current application duration being able to induce joule heating at a level sufficient to anneal a magnetic layer of a tunneling magnetoresistive (TMR) sensor into a recovered state;
    applying a current at the current level to a lead of the TMR sensor; and
    maintaining the current at the current level for the current application duration,
    wherein no external magnetic field is applied to the sensor during the current application duration,
    wherein the current does not pass through the magnetic layer when the current is applied to the lead.

10. A method as recited in claim 9, wherein the lead is also a lead used for applying a sense current to the sensor.

11. A method as recited in claim 9, wherein the lead is not used for applying a sense current to the sensor when the current is applied to the lead.

12. A method as recited in claim 9, wherein the current is applied in a drive having the sensor installed therein.

13. A method as recited in claim 9, wherein the drive is a tape drive.

14. A method as recited in claim 9, wherein the drive is a hard disk drive.

15. A method as recited in claim 9, further comprising applying a second current to a second lead of the sensor, the second lead being positioned on an opposite side of a tunnel junction layer of the TMR sensor as the first lead, the second current reducing a voltage differential across the magnetic layer.

16. A method as recited in claim 9, wherein the level of the current is between 1 mA and 100 mA, wherein the current application duration is between 30 seconds and 5 hours.

17. A method, comprising:
    characterizing thermodynamic parameters of a tunneling magnetoresistive (TMR) sensor;
    using the characterized thermodynamic parameters to determine a current level and a current application duration, the current level and a current application duration being able to induce joule heating at a level sufficient to anneal a magnetic layer of the sensor into a recovered state;
    characterizing thermal characteristics of the TMR sensor;
    applying a current at the current level to a first lead of the TMR sensor while a second lead, coupled to the first lead, is coupled to ground; and
    maintaining the current at the current level for the current application duration,
    wherein no external magnetic field is applied to the sensor during application of the current.

* * * * *